United States Patent [19]

Layton

[11] Patent Number: 4,799,041

[45] Date of Patent: Jan. 17, 1989

[54] RECIRCULATING ANALOG TO DIGITAL CONVERTER WITH AUTO-CALIBRATING FEATURE

[75] Inventor: James E. Layton, Ochelata, Okla.

[73] Assignee: Applied Automation, Inc., Bartlesville, Okla.

[21] Appl. No.: 915,433

[22] Filed: Oct. 6, 1986

[51] Int. Cl.$^4$ .................................................. H03M 1/38
[52] U.S. Cl. .................................... 341/120; 341/122; 341/158; 341/166
[58] Field of Search .... 340/347 CC, 347 M, 347 AD, 340/347 SH; 328/151

[56] References Cited

U.S. PATENT DOCUMENTS

| | | | |
|---|---|---|---|
| 3,495,238 | 2/1970 | Gabriel | 340/347 AD X |
| 3,588,881 | 6/1971 | Gordon | 340/347 AD |
| 4,315,253 | 2/1982 | Tytus | 340/347 CC |
| 4,337,456 | 6/1982 | Deffendall et al. | 340/347 NT |
| 4,385,286 | 5/1983 | Haque | 340/347 C X |
| 4,529,965 | 7/1985 | Lee | 340/347 AD |
| 4,590,458 | 5/1980 | Evans et al. | 340/347 AD |
| 4,593,268 | 6/1986 | Blauschild | 340/347 CC X |
| 4,602,374 | 7/1986 | Nakamura et al. | 340/347 CC X |

Primary Examiner—T. J. Sloyan
Attorney, Agent, or Firm—George E. Bogatie

[57] ABSTRACT

A recirculating type analog to digital converter is disclosed which has an auto-zero mode that is introduced prior to each conversion cycle. The loop is based on an arrangement of operational amplifiers and FET switches, and further includes a comparator circuit, a reference voltage source and a microprocessor which are coupled to the loop. Also coupled to appropriate points in the loop are three time gated integrator circuits which generate analog signals which respectively compensate for offset voltages of operational amplifiers in the loop, the offset voltage of the comparator circuit which is coupled to this loop, and the gain of the loop. The compensating signals which are generated in the auto-zero mode are applied to the loop during the conversion cycle.

11 Claims, 9 Drawing Sheets

RECIRCULATING ANALOG TO DIGITAL CONVERTER WITH AUTO-CALIBRATING FEATURE

The present invention relates to analog to digital conversion (ADC) apparatus. In one aspect it relates to iterative type converters based on a recirculating loop wherein the loop comprises an arrangement of operational amplifiers and field effect transistor (FET) switches connected to form the loop. In yet another aspect it relates to method and apparatus for automatically zeroing the amplifier offsets of the recirculation loop, and the offset of a comparator coupled to the loop, and for precisely adjusting the loop gain to improve the accuracy and resolution of the converter which is based on operational amplifiers and FET switches.

Many types of ADC apparatus are commercially available. In attempting to arrive at the optimum combination of accuracy, speed, noise immunity, and economy for a specific application each ADC type has certain attributes and qualifications. However, the iterative type converters are one of the most popular of the available types.

One economical approach to iterative type conversion is the recirculating ADC based on operational amplifiers and FET switches arranged in a loop. Typically a conversion loop is formed which includes operational amplifiers circuits such as: sample and hold, comparator, and a "times two" amplifier circuit required for the iterative recirculation algorithm. As used herein the "times two" amplifier is an operational amplifier having provisions for automatically adjusting the gain to two in response to voltage levels associated with the recirculation loop. In addition the loop includes switches, and a reference voltage source. Also associated with the loop is a digital register for storing a digital word.

The principles of loop operation are relatively simple. An input voltage to be converted is sampled through an input switch and held in a sample and hold circuit. The input switch is then opened and the input voltage, held in the sample and hold, is compared to zero volts. If the input voltage is equal to or greater than zero volts a first bit in a storage register is set equal to a logic 1. A new voltage is then formed that is "two times" the previous voltage minus a reference voltage. The new voltage is then recirculated to the input of the sample and hold through a feedback switch and the new voltage is treated as a new input.

If the input is less than zero the corresponding bit in the storage register is set equal to 0 and a new voltage is then formed that is "two times" the previous voltage plus a reference voltage. Then, as stated above, the new voltage is recirculated to the input of the sample and hold through a feedback switch and the new voltage is treated as a new input. The recirculation continues until the voltage is resolved into the last binary bit. The algorithm then starts over by directing a new input voltage sample he obtained.

The resolution of the above described recirculating ADC may be improved by generating more cycles between signal sampling intervals. However, the overall accuracy of the conversion is critically dependent on the precision of the operational amplifiers and for the described system the limit on resolution, due primarily to limitations of the op amps is about 10 bits.

In many applications for ADC's wide dynamic range and a correspondingly large number of bits for resolution are required. For example it is desirable to be able to operate a seismic exploration system which employ ADC's in environments having temperature extremes from artic to tropical. Further the amplitude of an analog seismic signal can vary over a wide range, and for this reason gain ranging amplifiers are typically employed in conjunction with a converter of fewer bits than needed. However this practice limits the linearity and resolution over the full range of the seismic analog signal.

It is well known that operational amplifiers employed in the recirculating converter have a dc output voltage, called the output offset voltage, even though no input signal is applied to the amplifier. This offset voltage is temperature dependent and produces troublesome outputs from the operational amplifier which limit the utility of the recirculation loop converter to applications where medium accuracy is required. It would be desirable to improve the recirculation loop converter to provide a high resolution conversion which is not limited by offset voltages associated with the operational amplifiers. It is also desireable to provide a recirculating converter which is easily reconfigurable to different resolutions.

It is thus an object of this invention to provide a novel recirculation loop for achieving a high resolution conversion. It is a further object of this invention to provide a recirculating converter wherein a microcomputer is used since the conversion can incorporate the microcomputer to provide a sequence of control signals for operating the FET switches which select the voltages applied to the circuit elements in the loop and wherein the sequence can be easily changed to provide a desired resolution. It is a particular objective of this invention to substantially eliminate offset voltages associated with the recirculation loop and to precisely adjust the gain of the "times two" amplifier in the recirculation loop thereby improving the resolution and versatility of applications for which the recirculating converter can be utilized.

In accordance with the present invention recirculating converter loop is provided which has an auto-zero mode that is introduced prior to each conversion cycle. In the auto zero mode, signal ground is applied to the input and amplifier offsets and the precise gain of the times two amplifier in the recirculation loop is automatically corrected by a dynamic calibration procedure. Calibration apparatus includes at least three time-gated integrator circuits which are respectively coupled to the recirculation loop. Each integrator is operative at predetermined times to generate a corresponding compensating signal in response to voltage levels at selected points in the recirculation loop. The compensating signals are utilized to (1) adjust offsets in a bit comparator circuit, (2) adjust the gain of the times two amplifier, and (3) adjust the reference voltage. In this manner the various errors associated with the recirculation loop i.e. the gain of the recirculation loop, the offset of the recirculation loop and offset of bit comparator associated with the recirculation loop are individually compensated.

Other objects and advantages of the invention will be apparent from the detailed description of the invention and the appended claims as well as from the brief description of the drawings in which:

Figure 1:
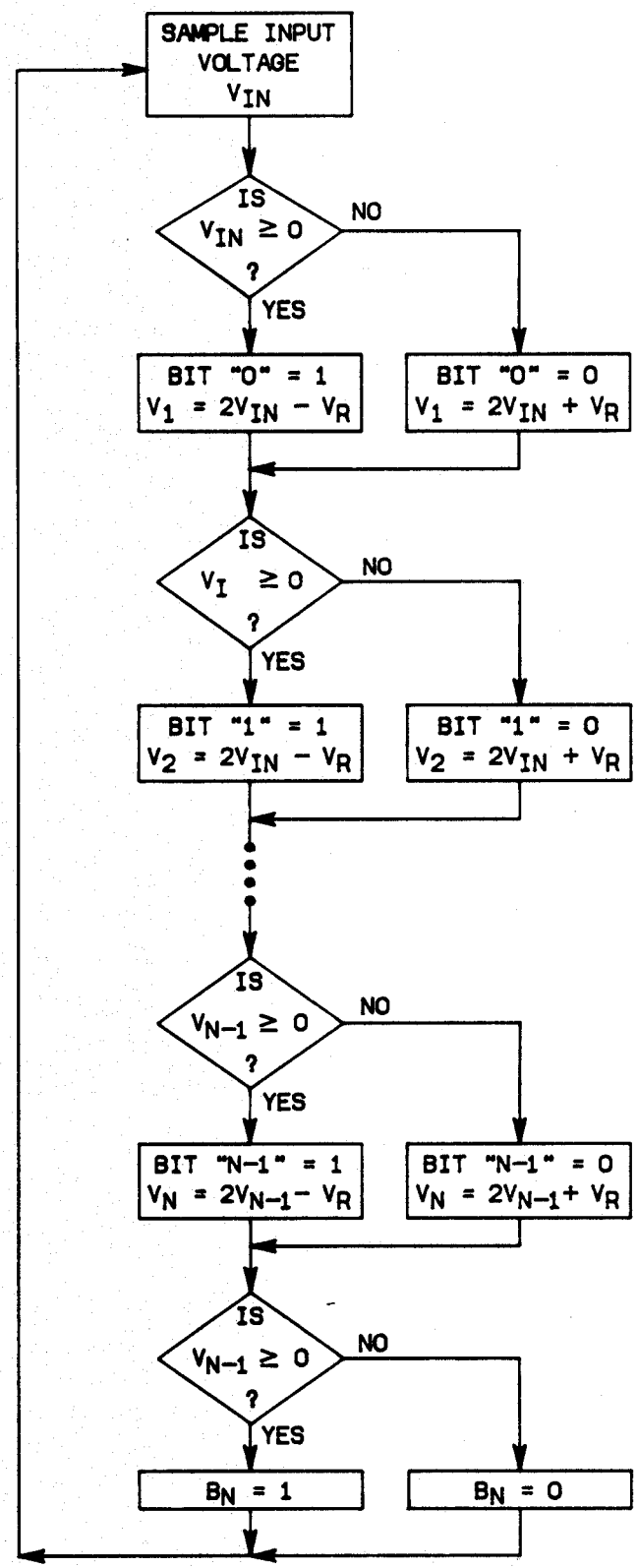
FIG. 1 is a computer flow diagram of the algorithm for the iterative recirculating analog-to-digital converter in accordance with which the present invention operates.

In FIG. 1 there is illustrated a flow chart of an algorithm for an iterative analog-to-digital converter based on a recirculation scheme. One basic operation in this scheme is an analog processing function in which a new voltage is formed that is two times a previous voltage, and adding or subtracting a reference voltage depending on whether or not the previous voltage is equal to or greater than zero. A second basic operation in the algorithm is a comparison of the new voltage to determine whether or not it is equal to or greater than zero, and for setting a binary digit in a storage register depending on the results of the comparison. Therefore, for an N-bit converter, the analog processing function and comparator functions are repeated N times.

From the flow chart in FIG. 1 it is observed that the iterative algorithm requires apparatus for accomplishing the "times two" amplification and for adding or subtracting a reference voltage. Further means are required to resolve the voltage level into a binary digit value.

Figure 2:
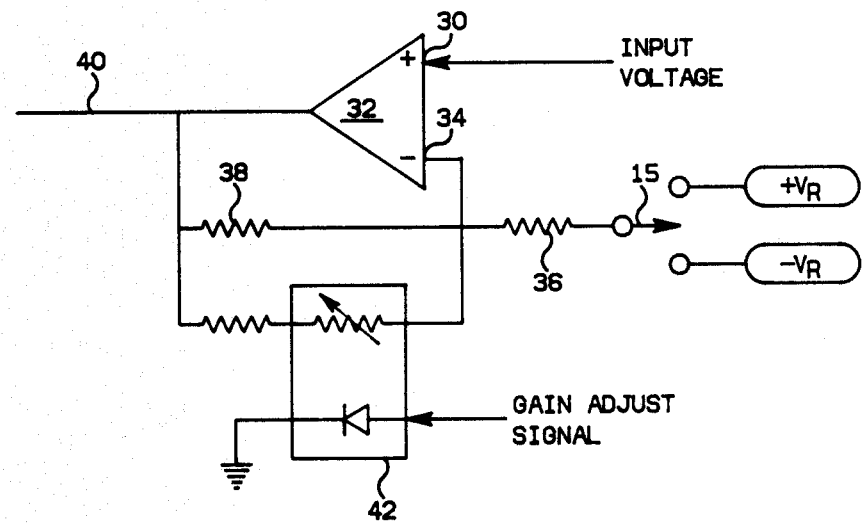
FIG. 2 is a schematic diagram of an operational amplifier in a non inverting configuration for utilization as the times two amplifier in accordance with the present invention.

This latter function is readily accomplished by a comparator circuit which compares the voltage level to be resolved to ground or zero volts and then sets an appropriate bit in a storage register depending on the results of the comparison. In accordance with the present invention the basic amplifier for implementing the times two function, illustrated in FIG. 2, is realized by configuring an operational amplifier 32 in a non-inverting configuration. In this configuration the input voltage is provided directly to the non-inverting input 30 of operational amplifier 32 and the appropriate polarity of the reference voltage, which is selected by switch 15 based on the results of the comparison function, is provided to the inverting input 34 of amplifier 32 through resistor 36. Therefore, with essentially equal resistor values for resistors 36 and 38, the amplifier 32 provides an output signal on line 40 that is two times the signal applied to the non-inverting inpupt 30, minus the signal applied to input resistor 36. In the preferred embodiment, however, resistor 36 is 9.9K ohms and resistor 38 is 10.0K ohms. In order to automatically adjust the gain in response to voltage levels associated with the recirculating converter, an optical circuit 42 and a resistor 44 are provided in parallel with resistor 38. As will be explained more fully hereinafter, a signal voltage which is representative of the actual gain of the recirculation loop is applied to the input of the optical circuit 42, and the resistance in parallel with resistor 38 is adjusted in response to the signal to provide the required times two amplification.

Figure 3:
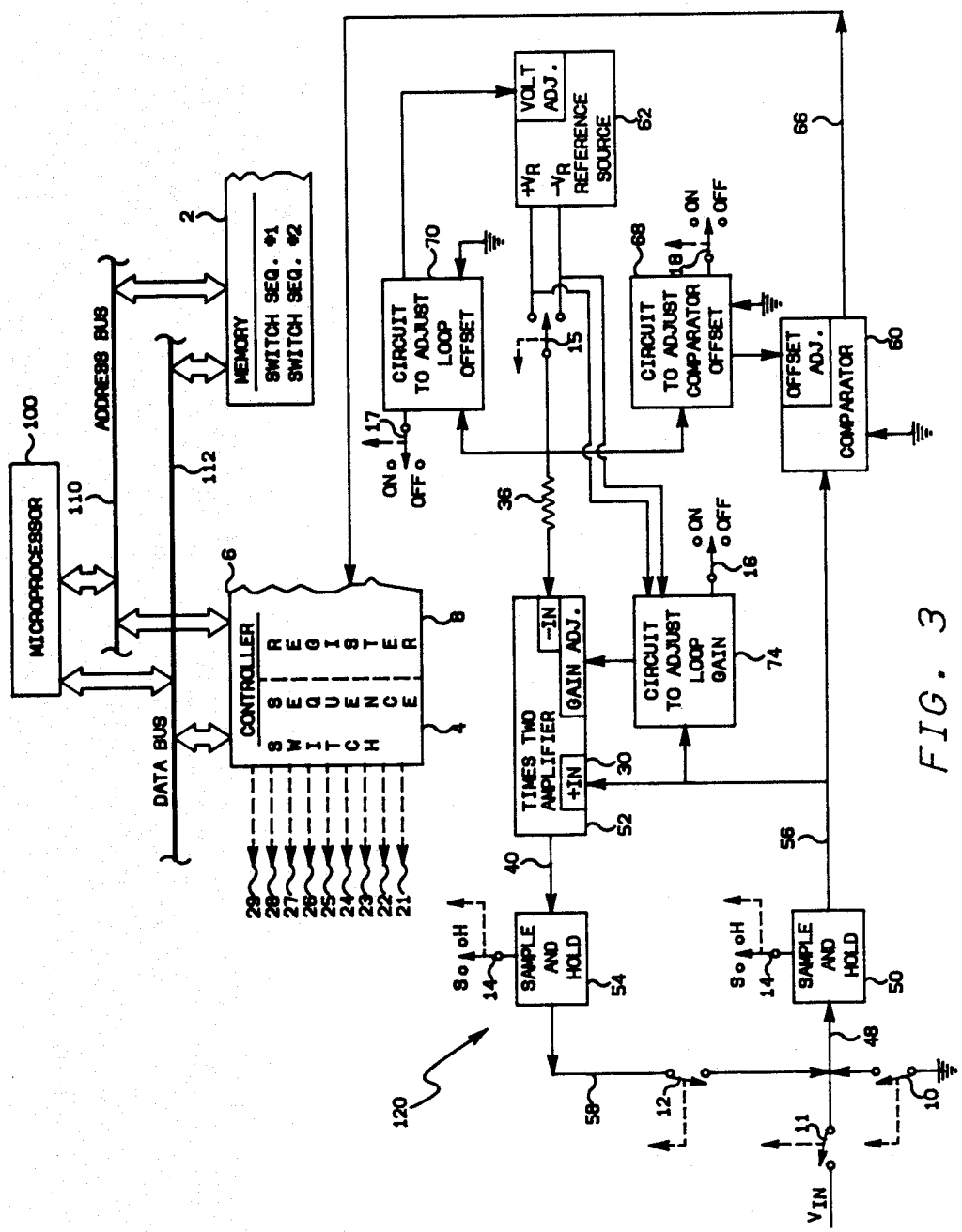
FIG. 3 is a block diagram of the recirculating converter circuit of the present invention and the microcomputer utilized to control the conversion.

In FIG. 3 there is illustrated an analog to digital conversion circuit including a microprocessor 100 which operates in accordance with the algorithm illustrated in FIG. 1. The microprocessor 100 has an associated memory 2 and an ADC controller 6 which includes a switch sequence section 4 and a storage register 8. The microprocessor 100, the memory 2 and the controller 6 are connected together by an address bus 110 and also by a data bus 112 so that various switch sequences stored in the memory 2 can be readily transferred to the controller 6, and the results of a conversion which appear in register 8 can be utilized by the microprocessor 100 for various calculations as may be necessary, or may be transferred under program control to another computer through an input/output port, not shown, for still further calculations and/or display of the digital data.

In the converter section of FIG. 3 generally indicated by reference numeral 120 there are shown nine selectively operated switches 10-18. Each of these nine switches can be selectively actuated in accordance with the corresponding signals provided on the select lines 20-28 from the switch sequencer 4. Several swtich sequence programs, which may differ, for example, in the number of cycles generated between signal sampling intervals, or the length of time that the converter remains in the auto-zero mode or the length of time that an adjustment circuit such as comparator offset adjust circuit 68, is turned on, etc. can be stored in the memory 2 associated with the microprocessor 100 and the desired switch program can be loaded into the switch sequencer section 4 of controller 6 for generating the desired sequence.

The switches 10-12 respectively provide for connecting analog voltages to be converted to the sample and hold circuit 50, via input line 48. For example, a ground potential is connected by switch 10, while an input signal voltage is connected by switch 11, and a new voltage formed in the times two amplifier 52, and held in the sample and hold circuit 54, is connected by switch 12.

The output line 56 from sample and hold circuit 50 is connected to the noninverting input 30 of the times two amplifier 52. The output line 40 of the times two amplifier 52 is connected to the input of sample and hold circuit 54. To complete the recirculation loop, the output line 58 of sample and hold circuit 54 is connected via switch 12 to line 48.

Switch 15 which is responsive to the output of comparator 60, selects the appropriate reference voltage from reference circuit 62 to be applied to the input resistor 36 of amplifier 52. In accordance with the algorithm illustrated in FIG. 1, the appearance of a logic 1 on the output line 66 of comparator 60 is effective in the controller circuit 6 and the microprocessor 100 for setting the appropriate bit in register 8 to a logic 1, and for selecting the negative reference voltage through switch 15. Thereby subtracting the reference voltage from two times the previous voltage, as required by the algorithm illustrated in FIG. 1.

Switches 13 and 14 provide for sampling or holding the inputs to sample and hold circuits 50 and 54 respectively. In the preferred sample and hold circuit as illustrated at numerals 50 and 54 in FIG. 7, a capacitance and a switch are placed in the feedback loop of the follower amplifier. This is in addition to the conventional switch and input capacitor typically associated with a follower amplifier to form a sample and hold. During the sample mode the input capacitor and the feedback capacitor are charged with the signal value through the same switch such that equal charge injection is applied to each capacitor. During the hold mode both the feedback switch and the sample switch are open. If the amplifier + and − input bias currents are equal and if the feedback and input capacitors are equal, the voltage across the capacitors will drift at the same rate keeping the output voltage constant.

Switches 16–18 are utilized in the auto-zero mode in conjunction with switch 10. Switches 16, 17, 18 respectively activate circuits 74, 70 and 68 which generate the compensating voltage signals.

Figure 4:
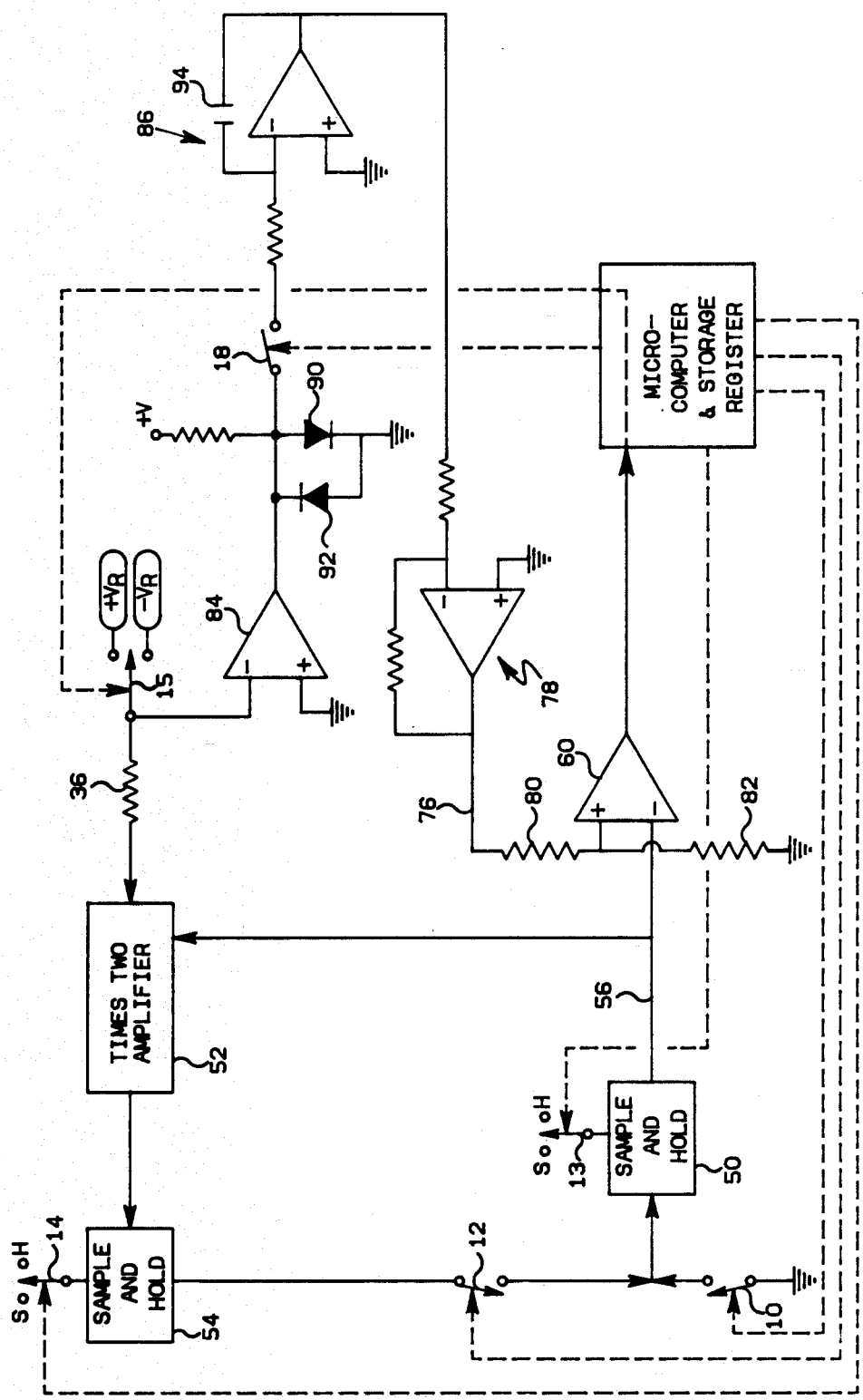
FIG. 4 is a schematic diagram of the preferred implementation of the circuit illustrated in FIG. 3 for adjusting the bit comparator offset voltage.

Referring now to FIG. 4 there is diagrammed circuitry for generating a signal voltage on line 76 at the output of unity gain inverting amplifier 78.

The signal voltage on line 76 is divided by a resistive voltage divider comprising resistor 80 and 82, and a portion of the signal voltage on line 76 is provided to the inverting input of comparator 60. The preferred apparatus for generating the signal voltage on line 76 includes comparator 84, swtich 18 and time gated integrator 86. A typical operation of the signal generating circuitry will be described in connection with the wave forms shown in FIG. 4A, which are generated by the switch sequencer 4 in FIG. 3.

Figure 4A:
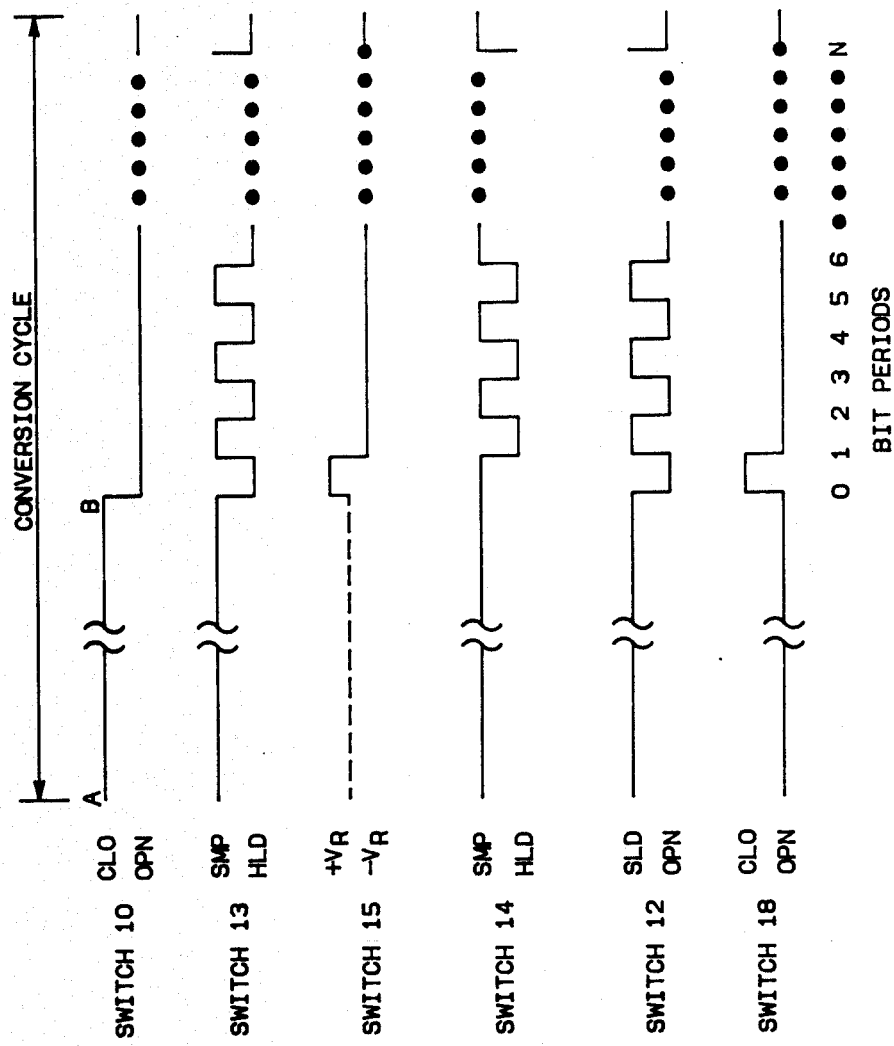
FIG. 4A is a timing diagram illustrating switch actuations for the circuit of FIG. 4 for providing an ADC function and offset adjustment in an auto-zero mode.

FIG. 4A illustrates the switch positions for an auto-zero mode conversion cycle. In the portion of the cycle from A to B, switch 10 is closed thus applying a signal ground to the input of sample and hold 50 while the sample and hold 50 is in its sampling mode. In the illustrated auto-zero cycle, the portion of the cycle from A to B has a duration of about 100 microseconds to insure complete discharge of the capacitors associated with the sample and hold circuits 50 and 54. At point B switch 10 is opened removing the signal ground from the input of sample and hold 50, however sample and hold 50 switches to the hold mode thus providing the signal ground to the bit comparator 60. At this same time switch 12 opens.

Also at time B, bit comparator 60 makes its first comparison of the conversion cycle. In the auto-zero cycle the first comparison is between the signal ground present on line 56 and the reference ground at the junction of resistor 80 and 82. If the reference ground is a higher voltage than the signal ground, the output of comparator 60 is a logic 1 as indicated in FIG. 4A by switch 15 selecting the positive reference voltage. Also at point B switch 18 is closed connecting the output of comparator 84, which is limited by silicon diodes 86 and 88, to the input of integrator 86. Since switch 15 has selected the positive reference voltage the output of comparator 84 is negative, thus causing integrator 86 to generate a positively sloped ramp voltage, which is inverted by inverting amplifier 78 to produce a negatively sloped ramp voltage for the compensating signal on line 76. Since switch 18 is closed for only one bit period, typically about 12 microseconds, the signal provided on line 76, which also depends on the RC constants of integrator 76, is a small incremental signal which is stored in capacitor 94 to adjust the offset of bit comparator 60 in the next cycle. It is noted that if the offset is large it may require several auto-zero cycles to correct the offset. On the other hand if there is no offset associated with comparator 60 successive iteration will produce alternating logic ones and zeros at the output of comparator 60 when signal ground is compared to the reference ground during the first iteration of the auto-zero cycle.

While an indication that an offset is present in the bit comparator 60 is most apparent during the first bit iteration of an auto-zero cylce, when the signal ground is compared to a reference ground, indication of offsets in the recirculating loop itself is most apparent after a number of iterations have been made around the loop. For example, after the first iteration in the auto-zero cycle the succession of new voltages formed for recirculation around the loop should consistently equal one polarity of the reference voltage, however, offsets in the loop can cause comparator 60 to select the opposite polarity reference voltage for the new voltage to be recirculated. Typically this occurs after offsets associated with the loop are multiplied several times during loop iterations.

Figure 5:
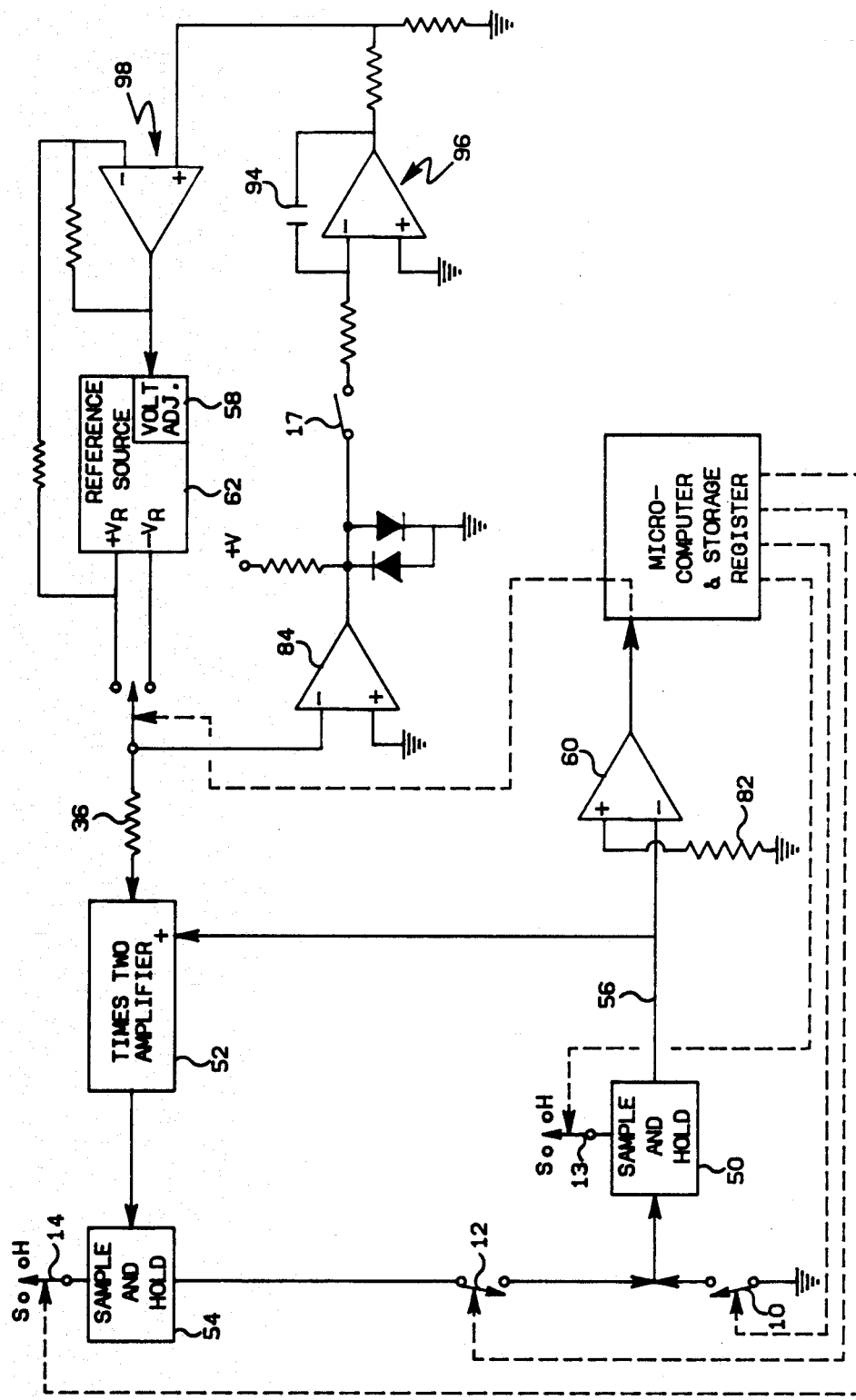
FIG. 5 is a schematic diagram of the preferred implementation of the circuit illustrated in FIG. 3 for adjusting the offset of the recirculation loop.
Figure 5A:
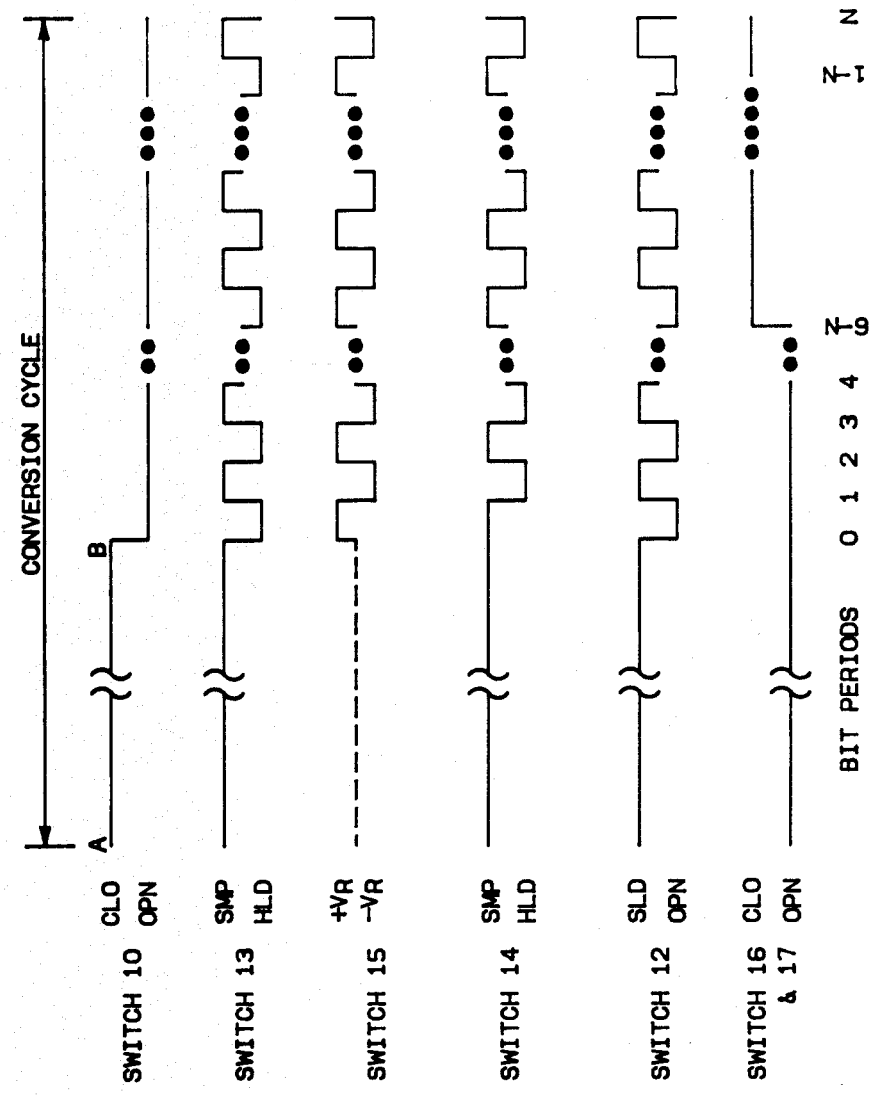
FIG. 5A is a timing diagram illustrating switch actuation for the circuit of FIG. 5 for providing an ADC function and offset adjustment in the auto-zero mode.

In FIG. 5 there is illustrated a circuit to for offsets in the recirculation loop, which includes comparator 84, switch 17, integrator 96 and differential amplifier 98 which applies the compensating signal to a voltage adjust input 58 on reference source 62. FIG. 5A illustrates the timing diagram for the switches illustrated in FIG. 5. For the auto-zero cycle, switch 17 is closed for about the last 10 bit periods.

Figure 6:
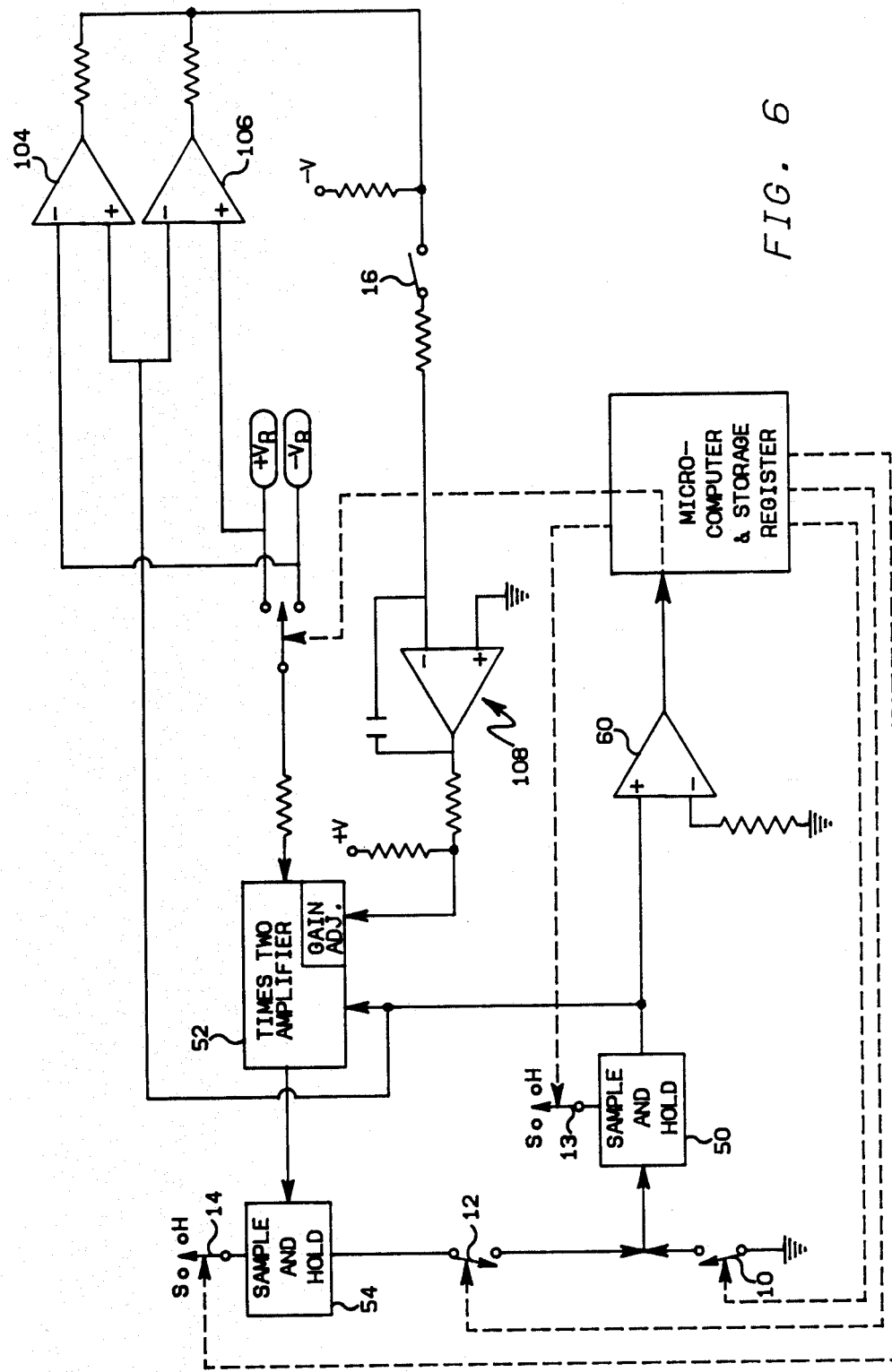
FIG. 6 is a schematic diagram of the preferred implementation of the circuit illustrated in FIG. 3 for adjusting the gain of the times two amplifier.

A circuit for trimming the gain of the times two amplifier 52 is illustrated in FIG. 6. Like the offsets in the recirculation loop an indication of an inappropriate gain for the times two amplifier is most apparent after a number of iterations have been made in the recirculation loop. Therefore as indicated in FIG. 5A for switch 17 it is preferred that switch 16 is closed for about the last 10 bit periods of the auto-zero cycle. As was previously mentioned in discussing switch 17, this period can be varied under program control if desired.

While examples of the preferred time periods for the activation of switches 16, 17, and 18 in the auto-zero cycle have been illustrated, it is noted that these switches may also be utilized during the conversion cycle to improve linearity of the converter. Generally the relative position within the cycle when the switches are activated is the same for the conversion cycle as for the auto-zero cycle i.e. switch 18 is activated during the first bit iteration and switches 16 and 17 are activated during the latter bit iterations. However it is presently preferred to reduce the length of time that the switches 16, 17 and 18 are activated in the conversion cycle to about 10% of the time that the switches are activated in the auto-zero cycle.

Figure 7:
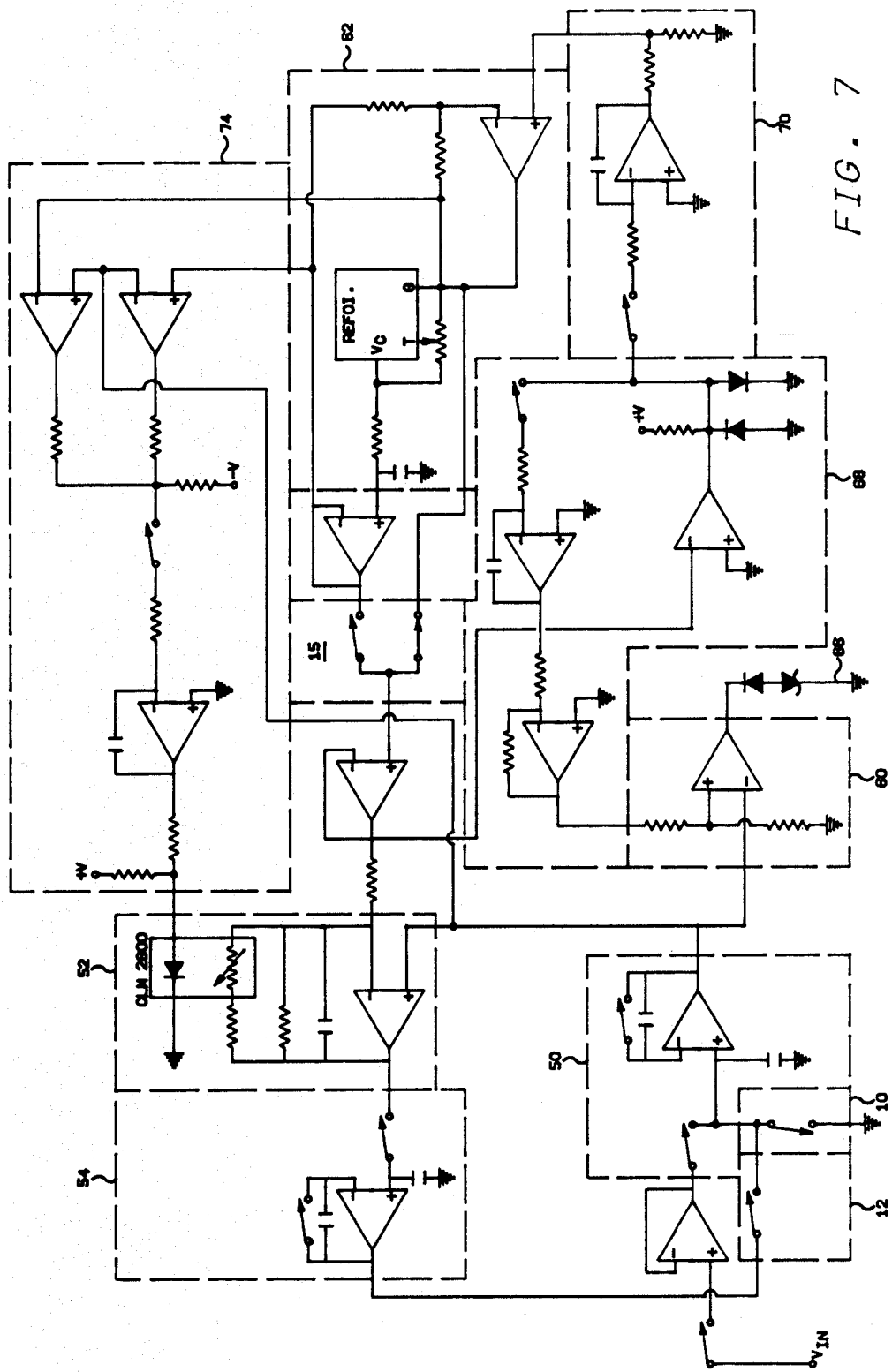
FIG. 7 is a schematic diagram of the preferred embodiment of the recirculating ADC in accordance with the present invention.

In FIG. 7 there is illustrated a schematic diagram for the ADC which is generally indicated at numeral 120 in FIG. 3. Reference numerals for the blocks diagrammed in FIG. 3 are retained in FIG. 7 in which dash lines enclose the specific circuitry corresponding to the blocks in FIG. 3.

The invention has been described in terms of a preferred embodiment for purposes explanation and illustration. It will be apparent, however, to those skilled in this art that many modifications and variations may be made without departing from the spirit of the invention, and such modifications and variations are within the scope of this invention.

The computer utilized in the present invention may be a commercially available one. For example, the microcomputer may be an MC6800 system manufactured by Motorola Semiconductor which includes the associated memory, storage registered and programmable switching logic. The programming to implement the functions required for the analog-to-digital conversion is within the ordinary skill of persons familiary with programming microcomputers.

Likewise the electronic components utilized in the converter are commercially available. For example, FET switches 10-18 may be DG 308 or DG 309 from Siliconix Inc., a suitable device for the reference voltage 62 may be a REF01 from Raytheon, the optical circuit 42 may be a CLM 6200 from Clairex, the operational amplifiers utilized are available from a large number of manufacturers.

That which is claimed is:

1. Apparatus for providing an analog-to-digital conversion of an analog signal wherein said analog-to-digital conversion is effected in a voltage recirculation loop and wherein a number of conversion iterations are included in a conversion cycle to resolve said analog signal into a number of binary bits, and wherein an auto-zero mode is introduced prior to an analog-to-digital conversion cycle, said apparatus comprising:

a first sample and hold circuit having an input and an output, wherein said first sample and hold circuit samples a voltage when a first switch means associated with said first sample and hold circuit is in a first position and wherein said first sample and hold circuit holds the voltage sampled when said first switch means was in said first position when said first switch means is switched to a second position;

an operational amplifier having a non-invering input, an inverting input, a gain adjust input, and an output;

a feedback resistor connected from said output to said inverting input of said operational amplifier;

an input resistor, having essentially equal value of resistance as said feedback resistor and having a first terminal connected to said inverting input of said operational amplifier whereby the unadjusted voltage gain of said operational amplifier if the input voltage is applied to the non-inverting input is approximately equal to two and wherein the unadjusted voltage gain of said operational amplifier if the input voltage is applied to said second terminal of said input resistor is approximately equal to unity;

means for connecting said output of said first sample and hold circuit to said non-inverting input of said operational amplifier;

a reference voltage source including a positive and a negative reference voltage;

a second switch means having a first position and a second position, wherein said positive reference voltage is connected to said second terminal of said input resistor when said second switch menas is in said first position, wherein said negative reference voltage is connected to said second terminal of said input resistor when said second switch means is in said second position;

means for establishing an adjustment signal responsive to the voltage appearing at the non-inverting input of said operational amplifier and the voltage of said reference voltage source, and for connecting said adjustment signal to said gain adjust input of said operational amplifier so that the gain of said operational amplifier is adjusted in response to said adjustment signal;

a second sample and hold circuit having an input and an output, wherein said second sample and hold circuit samples a voltage when a third switch means associated with said second sample and hold circuit is in a first position and wherein said second sample and hold circuit holds the voltage sampled when said third switch means was in said first position when said third switch means is switched to a second position;

means for connecting said output of said operational amplifier to said input of said second sample and hold circuit;

a fourth switch means for connecting said output of said second sample and hold circuit to said input of said first sample and hold circuit;

a fifth switch means for applying said analog signal to said input of said first sample and hold circuit;

a first comparator means operatively connected to said output of said first sample and hold circuit for comparing said output of said first sample and hold circuit to a base voltage and for producing a first digital signal therefrom;

a storage register for receiving said first digital signal and for producing a first switching signal responsive to said first digital signal;

means for connecting said first switching signal to said second switch means and for operating said second switch means in response to said first switching signal;

computer means for generating a second, a third, a fourth, and a fifth switching signal; and means for connecting said second, third, fourth and fifth switching signals to said first, third, fourth and fifth switch means respectively, wherein said first, third, fourth and fifth switch means are switched so as to effect a conversion of said analog signal to digital form in accordance with an iterative algorithm.

2. Apparatus in accordance with claim 1 wherein said base voltage is equivalent to a zero volt analog input signal.

3. Apparatus in accordance with claim 2 additionally comprising first circuit means for self compensating an offset voltage associated with said first comparator means to thereby reduce conversion inaccuracies in said analog-to-digital conversion cycle.

4. Apparatus in accordance with claim 3 additionally comprising second circuit means for self compensating offset voltage associated with said recirculation loop to thereby reduce conversion inaccuracies in said analog-to-digital conversion cycle.

5. Apparatus in accordance with claim 1 wherein said means for establishing an adjustment signal comprises:

means for comparing the voltage appearing at said non-inverting input of said operational amplifier and said positive reference voltage in a second comparator means and for establishing a second digital signal representative of said second comparison;

means for comparing the voltage appearing at said non-inverting input of said operational amplifier and said negative reference voltage is a third comparator and for establishing a third digital signal representative of said third comparison;

an integrator means;

means for combining said second and third digital signals to establish a fourth digital signal;

a sixth switch means for selectively connecting said fourth digital signal to said integrator means, wherein said fourth digital signal is integrated in said integrator means and the integration result establishes said adjustment signal.

6. Apparatus in accordance with claim 5 wherein said fourth digital signal is integrated in said integration means during the last ten iterations during operation in said auto-zero mode.

7. A method of reducing gain and offset errors in an analog-to-digital converter system wherein an iterative type conversion is accomplished in a voltage recirculation loop comprising an arrangement of an operational amplifier having inverting and non-inverting inputs and having an input for adjusting voltage gain, a pair of sample and hold circuits and a plurality of FET switches, and wherein a first comparator circuit and a reference voltage source including positive and negative reference voltages are coupled to said recirculation loop, and wherein first and second circuit means are provided for compensating offset voltage, and further wherein an auto-zero mode is introduced prior to an analog-to-digital conversion cycle, said method comprising the steps of:

applying a signal ground to the input of said analog-to-digital converter system for operating said system in said auto-zero mode;

establishing an adjustment signal responsive to the signal voltage appearing at said non-inverting input of said operational amplifier and said reference voltage source, wherein said adjustment signal attains a first voltage level during operation in said auto-zero mode;

adjusting the gain of said operational amplifier in response to said adjustment signal during at least a portion of the conversion iterations during operation in said auto-zero mode;

maintaining said first voltage level during the following analog-to-digital conversion cycle, and adjusting the gain of said operational amplifier in response to said first voltage level during said analog-to-digital conversion cycle;

comparing the voltage appearing at said inverting input of said operational amplifier to zero volts in a second comparator and producing a first digital signal from said second comparison;

integrating said first digital signal for a first predetermined time interval during at least a portion of the conversion iterations during operation in said auto-zero mode to establish a first analog compensation signal, wherein said first analog compensation signal attains a second voltage level during operation in said auto-zero mode;

adding said first analog compensation signal to an input of said first comparator circuit during at least a portion of said auto-zero mode;

maintaining said second voltage level during the following analog-to-digital conversion cycle, and for adjusting the offset voltage of said first comparator in response to said second voltage level during said analog-to-digital conversion cycle;

integrating said first digital signal for a second predetermined time interval during at least a portion of the conversion iterations during operation in said auto-zero mode to establish a second analog compensation signal, wherein said second analog compensation signal attains a third voltage level during operation in said auto-zero mode;

adjusting said reference voltage source in response to said second analog compensating signal during at least a portion of the iterations during operation in said auto-zero mode; and maintaining said third voltage level during the following analog-to-digital conversion cycle, for for adjusting said reference voltage source in response to said third voltage level during said analog-to-digital conversion cycle.

8. Apparatus for providing an analog to digital conversion of an analog signal wherein said analog-to-digital conversion is effected in a voltage recirculation loop and wherein a number of conversion iterations are included in an analog-to-digital conversion cycle to resolve said analog signal into a number of binary bits and wherein an auto zero mode is introduced prior to said analog-to-digital conversion cycle, said apparatus comprising:

a first sample and hold circuit having an input and an output, wherein said first sample and hold circuit samples a voltage when a first switch means associated with said first sample and hold circuit is in a first position and wherein said first sample and hold circuit holds the voltage sampled when said first switch means was in said first position when said first switch means is switched to a second position;

an operational amplifier having a non-inverting input, an inverting input, a gain adjust input, and an output;

a feedback resistor connected from said output to said inverting input of said operational amplifier;

an input resistor, having essentially equal valve of resistance as said feedback resistor and having a first terminal connected to said inverting input of said operational amplifier whereby the unadjusted voltage gain of said operational amplifier if the input voltage is applied to the non-inverting input is approximately equal to two and wherein the unadjusted voltage gain of said operational amplifier if the input voltage is applied to said second terminal of said input resistor is approximately equal to unity;

means for connecting said output of said first sample and hold circuit to said non-inverting input of said operational amplifier;

a reference voltage source including a positive and a negative reference voltage;

a second switch means having a first position and a second position, wherein said positive reference voltage is connected to said second terminal of said input resistor when said second switch means is in said first position, wherein said negative reference voltage is connected to said second terminal of said input resistor when said second switch means is in said second position;

a second sample and hold circuit having an input and an output, wherein said second sample and hold circuit samples a voltage when a third switch means associated with said second sample and hold circuit is in a first position and wherein said second sample and hold circuit holds the voltage sampled when said third switch means was in said first position when said third switch means is switched to a second position;

means for connecting said output of said operational amplifier to said input of said second sample and hold circuit;

a fourth switch means for connecting said output of said second sample and hold circuit to said input of said first sample and hold circuit;

a fifth switch means for applying said analog signal to said input of said first sample and hold circuit;

a first comparator means operatively connected to said output of said first sample and hold circuit for comparing said output of said first sample and hold circuit to a base voltage and for producing a first digital signal therefrom;

a storage register for receiving said first digital signal and for producing a first switching signal responsive to said first digital signal;

means for connecting said first switching signal to said second switch means and for operating said second switch means in rsponse to said first switching signal;

computer means for generating a second, a third, a fourth, and a fifth switching signal;

means for connecting said second, third, fourth and fifth switching signals to said first, third, fourth and fifth switch means respectively, wherein said first, third, fourth and fifth switch means are switched so as to effect a conversion of said analog signal to digital form in accordance with an iterative algorithm;

a second comparator means operatively connected to said second terminal of said input resistor for comparing the voltage at said second terminal of said input resistor to zero volts and for producing a second digital signal therefrom;

a first integrating circuit having an input and an output;

a sixth switch means for applying said second digital signal to said input of said first integrating circuit during a portion of said auto-zero mode, wherein said first integrating circuit integrates said second digital signal for a predetermined time interval during said auto-zero mode to generate a first analog compensating signal;

means for adding said first analog compensating signal to an input of said first comparator means during said auto-zero mode; and means for maintaining said first analog compensating signal at said input of said first comparator during said analog to digital conversion cycle, wherein said offset voltage of said comparator means is reduced when said first analog compensating signal is added to said input of said comparator means.

9. Apparatus in accordance with claim 8 wherein said reference voltage source has a volt adjust input and wherein said second circuit means for self compensating offset voltages associated with said recirculation loop comprises:

a second integrating circuit having an input and an output, a seventh switch means for applying said second digital signal to said input of said second integrating circuit during a portion of said auto-zero mode, wherein said second integrating circuit integrates said second digital signal for a predetermined time interval to generate a second analog compensating signal;

means for applying said second analog compensating signal to said volt adjust input of said reference voltage source during said auto-zero mode, means for maintaining said second analog compensating signal at said volt adjust input of said reference voltage source during said analog-to-digital conversion cycle.

10. A method of reducing offset errors in an analog-to-digital converter system wherein an iterative type conversion is accomplished in a voltage recirculation loop comprising an arrangement of an operational amplifier having inverting and non-inverting inputs and having an input for adjusting voltage gain, a pair of sample and hold circuits and a plurality of FET switches, and wherein a first comparator circuit and a reference voltage source including positive and negative reference voltages are coupled to said recirculation loop, and further wherein an auto-zero mode is introduced prior to an analog-to-digital conversion cycle, said method comprising the steps of:

applying a signal ground to the input of said analog-to-digital converter system for operating said system in said auto-zero mode;

establishing an adjustment signal responsive to the signal voltage appearing at said non-inverting input of said operational amplifier and said reference voltage source, wherein said adjustment signal attains a first voltage level during operation in said auto-zero mode;

adjusting the gain of said operational amplifier in response to said adjustment signal during at least a portion of the iterations during operation in said auto-zero mode; and maintaining said first voltage level during the following analog-to-digital conversion cycle, and adjusting the gain of said operational amplifier in response to said first voltage level during said analog-to-digital conversion cycle.

11. A method in accordance with claim 10 wherein a first circuit means is provided for self compensating offset voltages associated with said first comparator, said method additionally comprising the steps of:

comparing the voltage appearing at said inverting input of said operational amplifier to zero volts in a second comparator and producing a first digital signal from said second comparison;

integrating said first digital signal for a first predetermined time interval during at least a portion of the conversion iterations during operation in said auto-zero mode to establish a first analog compensation signal, wherein said first analog compensation signal attains a second voltage level during operation in said auto-zero mode;

adding said first analog compensation signal to an input of said first comparator circuit during at least a portion of said auto-zero mode; and maintaining said second voltage level during the following analog-to-digital conversion cycle, and for adjusting the offset voltage of said first comparator in response to said second voltage level during said analog-to-digital conversion cycle.

* * * * *